US009824764B2

(12) United States Patent
Kanamori et al.

(10) Patent No.: US 9,824,764 B2
(45) Date of Patent: Nov. 21, 2017

(54) SEMICONDUCTOR MEMORY DEVICE

(71) Applicant: Toshiba Memory Corporation, Minato-ku (JP)

(72) Inventors: Yuki Kanamori, Kamakura (JP); Yuji Nagai, Sagamihara (JP); Jun Nakai, Yokohama (JP); Kenri Nakai, Fujisawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/258,150

(22) Filed: Sep. 7, 2016

(65) Prior Publication Data

US 2017/0271017 A1 Sep. 21, 2017

Related U.S. Application Data

(60) Provisional application No. 62/308,506, filed on Mar. 15, 2016.

(51) Int. Cl.

| | |
|---|---|
| ***G11C 16/04*** | (2006.01) |
| ***G11C 16/12*** | (2006.01) |
| ***G11C 16/34*** | (2006.01) |

(52) U.S. Cl.
CPC .......... *G11C 16/12* (2013.01); *G11C 16/3459* (2013.01)

(58) Field of Classification Search
CPC . G11C 16/0483; G11C 16/10; G11C 11/5628; G11C 16/12; G11C 16/3459
USPC ....................................... 365/185.17, 185.19
See application file for complete search history.

(56) References Cited

U.S. PATENT DOCUMENTS 7,489,549 B2 2/2009 Mokhlesi
9,076,536 B2 7/2015 Nagadomi
2005/0248992 A1* 11/2005 Hwang .............. G11C 16/3454 365/185.28
2016/0012902 A1 1/2016 Harada et al.

* cited by examiner

*Primary Examiner* — Huan Hoang
(74) *Attorney, Agent, or Firm* — Oblon, McClelland, Maier & Neustadt, L.L.P.

(57) ABSTRACT

A semiconductor memory device according to an embodiment includes: a memory cell array including a plurality of memory cells that are NAND-connected; and a control circuit that executes a write sequence, the write sequence writing data to the memory cells, the write sequence including a plurality of write stages, one of the write stages applying to the memory cells a plurality of program pulses whose amplitudes increase by a certain increment, the write stages including 1st to Nth, where N is an integer of 2 or more, write stages, and an initial amplitude and the increment of the program pulse applied in the N−1th write stage being the same as an initial amplitude and the increment of the program pulse applied in the Nth write stage.

19 Claims, 14 Drawing Sheets

SEMICONDUCTOR MEMORY DEVICE

CROSS-REFERENCE TO RELATED APPLICATIONS

This application is based upon and claims the benefit of priority from the prior U.S. Provisional Application 62/308,506, filed on Mar. 15, 2016, the entire contents of which are incorporated herein by reference.

BACKGROUND

Field

Embodiments of the present invention relate to a semiconductor memory device.

Description of the Related Art

One example of a semiconductor memory device is a NAND type flash memory. This flash memory has for a long time been utilized in wide applications such as a memory card or a USB memory. Furthermore, accompanying increasingly large capacities of recent years, an SSD (Solid State Drive) that utilizes the flash memory has become commercially available. This SSD is a large capacity storage medium that replaces a conventional HDD (Hard Disc Drive) and has a characteristic of operating at higher speed and with lower power consumption compared to the HDD. Currently, the SDD is widely utilized not only in personal computers, but also in the likes of business-oriented servers.

DETAILED DESCRIPTION

A semiconductor memory device according to an embodiment comprises: a memory cell array including a plurality of memory cells that are NAND-connected; and a control circuit that executes a write sequence, the write sequence writing data to the memory cells, the write sequence including a plurality of write stages, one of the write stages applying to the memory cells a plurality of program pulses whose amplitudes increase by a certain increment, the write stages including 1st to Nth, where N is an integer of 2 or more, write stages, and an initial amplitude and the increment of the program pulse applied in the N−1th write stage being the same as an initial amplitude and the increment of the program pulse applied in the Nth write stage.

Semiconductor memory devices according to embodiments will be described below with reference to the drawings.

First Embodiment

First, an overall configuration of a semiconductor memory device according to a first embodiment will be described.

Figure 1:
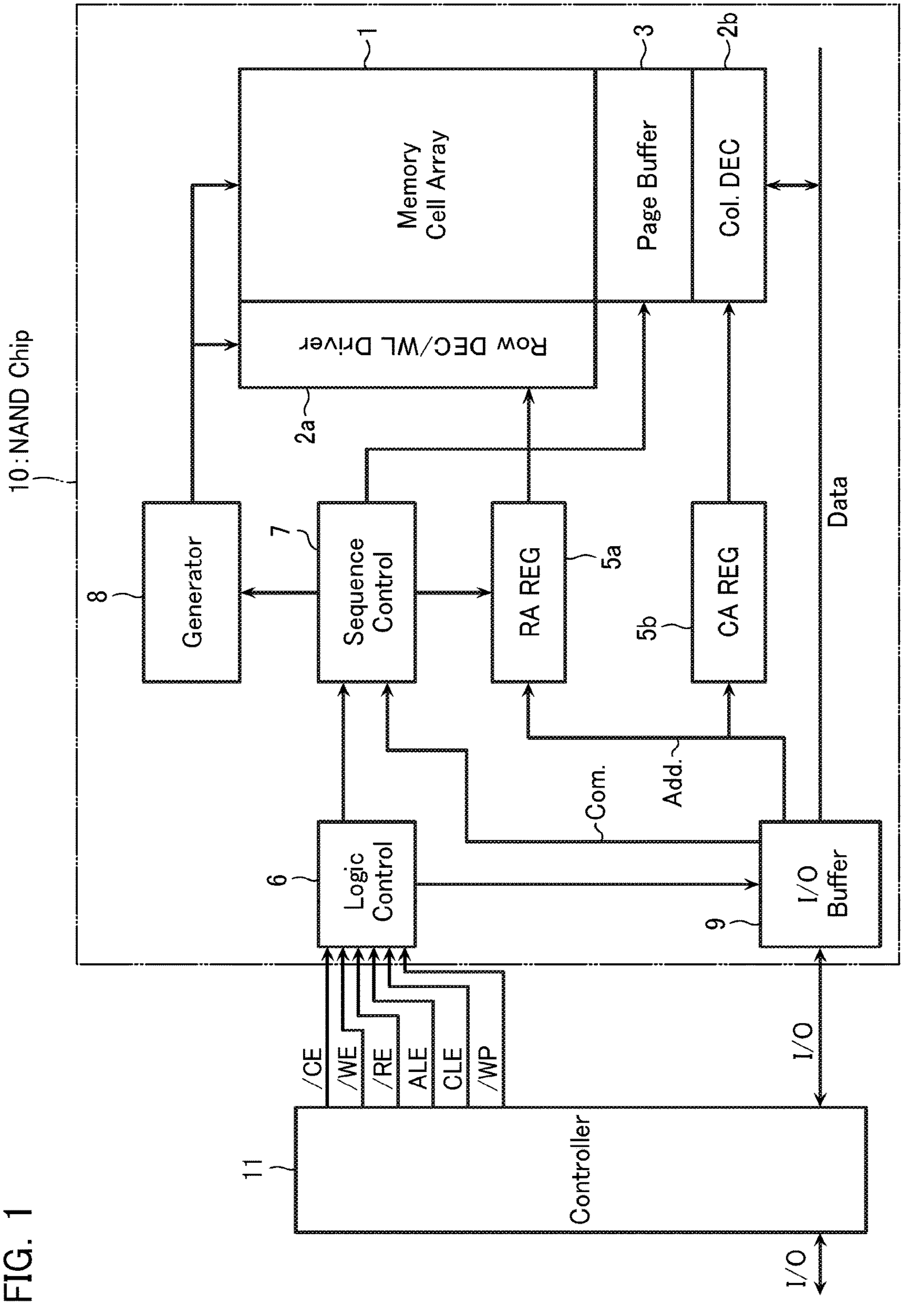
FIG. 1 is a functional block diagram of a semiconductor memory device according to a first embodiment.

FIG. 1 is a functional block diagram of the semiconductor memory device according to the present embodiment.

This semiconductor memory device configures a NAND type flash memory and comprises: a NAND chip 10; and a controller 11 that controls this NAND chip 10. Of these, the controller 11 is included in a control circuit.

The NAND chip 10 comprises a memory cell array 1. The memory cell array 1 is divided into a plurality of memory blocks which are not illustrated. Each of the memory blocks includes the following which are not illustrated, namely: a plurality of bit lines; a plurality of word lines; a source line; and a plurality of memory cells selected by the bit line and the word line. A group of memory cells selected by one word line configures a page. Data write/read of the flash memory is performed in a page unit, and data erase is performed in a memory block unit.

In addition, the NAND chip 10 comprises a peripheral circuit for executing the following, namely: a write sequence which is a series of processings of data write; an erase sequence which is a series of processings of data erase; and a read sequence which is a series of processings of data read. The peripheral circuit includes: a row decoder/word line driver 2*a*; a column decoder 2*b*; a page buffer 3; a row address register 5*a* and column address register 5*b*; a logic control circuit 6; a sequence control circuit 7; a voltage generating circuit 8; and an I/O buffer 9.

The row decoder/word line driver 2*a* drives the word line and a select gate line of the memory cell array 1. The page buffer 3 includes a one page portion of sense amplifier circuits and latch circuits. A one page portion of read data stored by the page buffer 3 is sequentially column selected by the column decoder 2*b* to be outputted to an external I/O terminal via the I/O buffer 9. Write data supplied from the I/O terminal is selected by the column decoder 2*b* to be loaded into the page buffer 3. The page buffer 3 is loaded with a one page portion of write data. Row and column address signals are inputted via the I/O buffer 9 and transferred to the row decoder 2*a* and column decoder 2*b*, respectively. The row address register 5*a* stores an erase block address in the case of data erase, and stores a page address in the case of data write/read. The column address register 5*b* is inputted with a leading column address for loading write data before start of the write sequence, or a leading column address for the read sequence. The column address register 5*b* stores the inputted column address until a write enable signal /WE or a read enable signal /RE is toggled by a certain condition.

The logic control circuit 6 controls input of a command or an address, and input/output of data, based on control signals such as a chip enable signal /CE, a command latch enable signal CLE, an address latch enable signal ALE, the write enable signal /WE, the read enable signal /RE, and a write protect signal /WP. The sequence control circuit 7 receives a command from the logic control circuit 6 and controls the write sequence, the erase sequence, and the read sequence, based on this command. The voltage generating circuit 8 is controlled by the sequence control circuit 7 to generate certain voltages required for various operations.

The controller 11 controls the write sequence, the erase sequence, and the read sequence by conditions appropriate to a current state of the NAND chip 10. Note that parts of these sequences may be controlled by the peripheral circuit of the NAND chip 10.

Next, the memory cell array 1 will be described.

Figure 2:
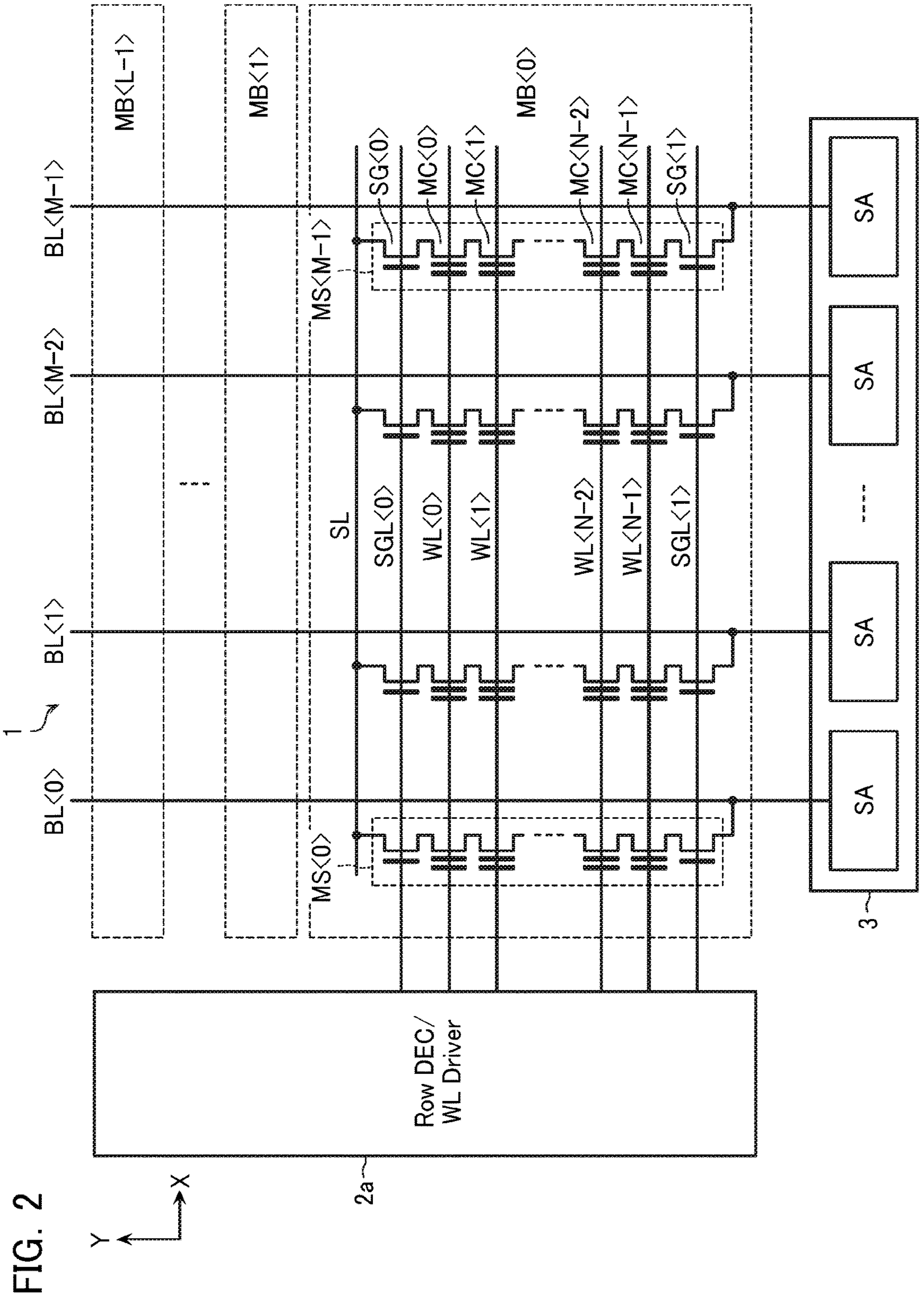
FIG. 2 is a circuit diagram of a memory cell array of the semiconductor memory device according to the same embodiment.

FIG. 2 is a circuit diagram of the memory cell array of the semiconductor memory device according to the present embodiment.

The memory cell array 1 includes: word lines WL<0> to WL<N−1>, select gate lines SGL<0> and SGL<1>, and a source line SL that extend in an X direction; bit lines BL<0> to BL<M−1> that extend in a Y direction; and memory strings MS<0> to MS<M−1> provided corresponding to each of the bit lines BL<0> to BL<M−1>. Each of the memory strings MS includes: N memory cells MC<0> to MC<N−1> connected in series; and select gates SG<0> and SG<1> connected to both ends of those series-connected memory cells MC<0> to MC<N−1>. Each of the memory cells MC is configured from a transistor having a structure in which a floating gate acting as a charge accumulation layer and a control gate are stacked, via an insulating film, on a well (hereafter, sometimes also referred to as "cell well") of a semiconductor substrate. Moreover, the select gate SG is configured from a transistor having a structure in which the gates are stacked, via the insulating film, above the cell well. Note that the select gate SG has its floating gate and control gate short-circuited, hence can utilize a transistor having a similar structure to that of the memory cell MC.

A source of the select gate SG<0> is connected to the source line SL. A drain of the select gate SG<1> is connected to one of the bit lines BL<0> to BL<M−1>. Control gates of the memory cells MC<0> to MC<N−1> are connected to the word lines WL<0> to WL<N−1>. Gates of the select gates SG<0> and SG<1> are connected to the select gate lines SGL<0> and SGL<1>.

In the above-described configuration, the M memory strings MS aligned in the X direction configure one memory block MB. The memory cell array 1 includes L memory blocks MB<0> to MB<L−1> aligned in the Y direction.

The word line WL and the select gate line SGL are driven by the row decoder 2*a*. Moreover, each of the bit lines BL is connected to a sense amplifier circuit S/A of the page buffer 3.

Next, data storage of the memory cell will be described. Note that hereafter, each of the embodiments will be described exemplifying 3 bits/cell, but these embodiments may be applied also in the cases of 1 bit/cell or 2 or more bits/cell.

Figure 3:
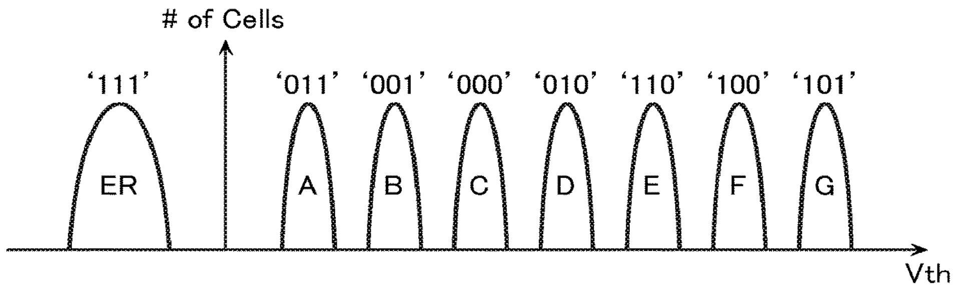
FIG. 3 is a view showing a threshold distribution of a memory cell of the semiconductor memory device according to the same embodiment.

FIG. 3 is a view showing a threshold distribution of the memory cell of the semiconductor memory device according to the present embodiment.

The memory cell stores a plurality of data in a nonvolatile manner by a plurality of different threshold distributions. In the case of 3 bits/cell, each of the memory cells has the following eight threshold distributions, sequentially from a low voltage side, namely, an ER level, an A level, a B level, a C level, a D level, an E level, an F level, and a G level, and these threshold distributions are assigned with '111', '011', '001', '000', '010', '110', '100', and '101' to store 3 bits of data. A threshold voltage Vth of the memory cell is determined by the number of electrons stored by the floating gate. Hereafter, a state of the memory cell of the ER level will sometimes also be referred to as "erase state", and a state of the memory cell of the A to G levels will sometimes also be referred to as "program state". Moreover, the A to G levels will sometimes also be referred to as "fine level".

Next, operations of the semiconductor memory device will be described.

As previously mentioned, data write/erase/read to the memory cell are achieved by series of processings called sequences. Of these, the write sequence which is particularly relevant to the present embodiment is configured by two operations, that is, a program operation and a verify operation.

First, the program operation of the write sequence will be described.

Figure 4:
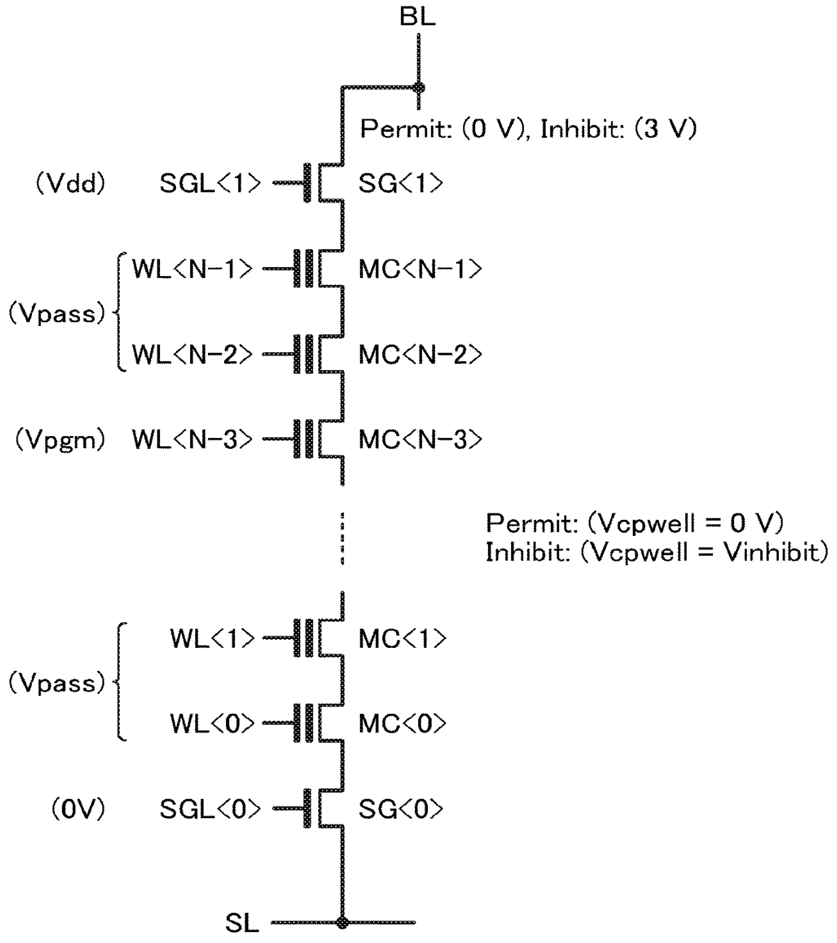
FIG. 4 is a view showing a bias state of the memory cell array during a program operation in the semiconductor memory device according to the same embodiment.

FIG. 4 is a view showing a bias state of the memory cell array during the program operation in the semiconductor memory device according to the present embodiment. FIG. 4 is an example assuming the memory cell MC<N−3> to be a selected memory cell.

The program operation is an operation that causes the threshold voltage Vth of the memory cell MC to undergo transition to a high voltage side.

In the case of causing the threshold voltage Vth of the memory cell MC to undergo transition to the high voltage side, in other words, in the case of permitting a program on the memory cell MC, the cell well is set to a voltage Vcpwell=0 V, for example, the select gate line SGL<0> is applied with 0 V, for example, the select gate line SGL<1> is applied with a power supply voltage Vdd, and the bit line BL is applied with 0 V, for example. In addition, an unselected word line WL is applied with a pass voltage Vpass (for example, 10V), and a selected word line WL<N−3> is applied with a program voltage Vpgm (for example, 20 V). As a result, a large potential difference occurs between the cell well and the selected word line WL<N−3>, and electrons are injected into the floating gate of the selected memory cell MC<N−3>. As a result, the threshold voltage Vth of the selected memory cell MC<N−3> undergoes transition to the high voltage side.

Conversely, in the case of not causing the threshold voltage Vth of the memory cell MC to undergo transition, in other words, in the case of inhibiting a program on the memory cell MC, the select gate line SGL<0> is applied with 0 V, for example, the select gate line SGL<1> is applied with the power supply voltage Vdd, and the bit line BL is applied with 3 V, for example. In addition, the unselected word line WL is applied with the pass voltage Vpass, and the selected word line WL<N−3> is applied with the program voltage Vpgm (for example, 20 V). In this case, the voltage Vcpwell of the cell well rises to a certain inhibit voltage Vinhibit due to an effect of coupling with the word line WL. As a result, a large potential difference does not occur between the cell well and the selected word line WL<N−3>, and injection of electrons into the floating gate of the selected memory cell MC<N−3> is inhibited. As a result, the threshold voltage Vth of the selected memory cell MC<N−3> is maintained unchanged without undergoing transition.

Next, the verify operation of the write sequence will be described.

Figure 5:
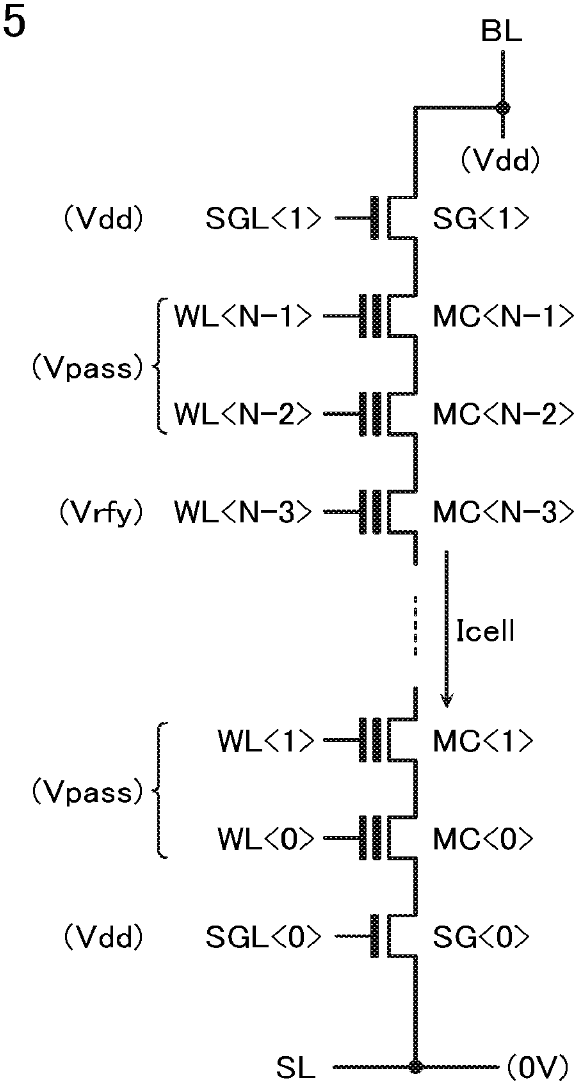
FIG. 5 is a view showing a bias state of the memory cell array during a verify operation in the semiconductor memory device according to the same embodiment.

FIG. 5 is a view showing a bias state of the memory cell array during the verify operation in the semiconductor memory device according to the present embodiment. FIG. 5 is an example assuming the memory cell MC<N−3> to be the selected memory cell.

The verify operation is an operation that confirms whether the memory cell MC has a desired threshold voltage Vth.

In the case of confirming the threshold voltage Vth of the memory cell MC, the bit line BL is pre-charged to the power supply voltage Vdd, the source line SL is applied with 0 V, for example, the select gate lines SGL<0> and SGL<1> and the unselected word line WL are applied with the pass voltage Vpass, and the selected word line WL<N−3> is applied with a verify voltage Vvfy (for example, 0.5 V). Now, the verify voltage Vvfy is a voltage of a lower limit of a threshold distribution of a program state. As a result, when a threshold voltage of the selected memory cell MC<N−3> is Vth≤Vvfy, all of transistors of the memory string MS including the selected memory cell MC<N−3> attain an on state, and a cell current Icell flows from the bit line BL toward the source line SL. On the other hand, when the threshold voltage of the selected memory cell MC<N−3> is Vth> Vvfy, a transistor of the selected memory cell MC<N−3> attains an off state, hence the cell current Icell does not flow in the memory string MS. Then, by detecting presence/absence of the cell current Icell flowing on the bit line BL by the sense amplifier circuit SA, it can be confirmed whether the threshold voltage of the memory cell MC is Vth>Vvfy.

Next, a write sequence employing the above-described program operation and verify operation will be described.

Figure 6:
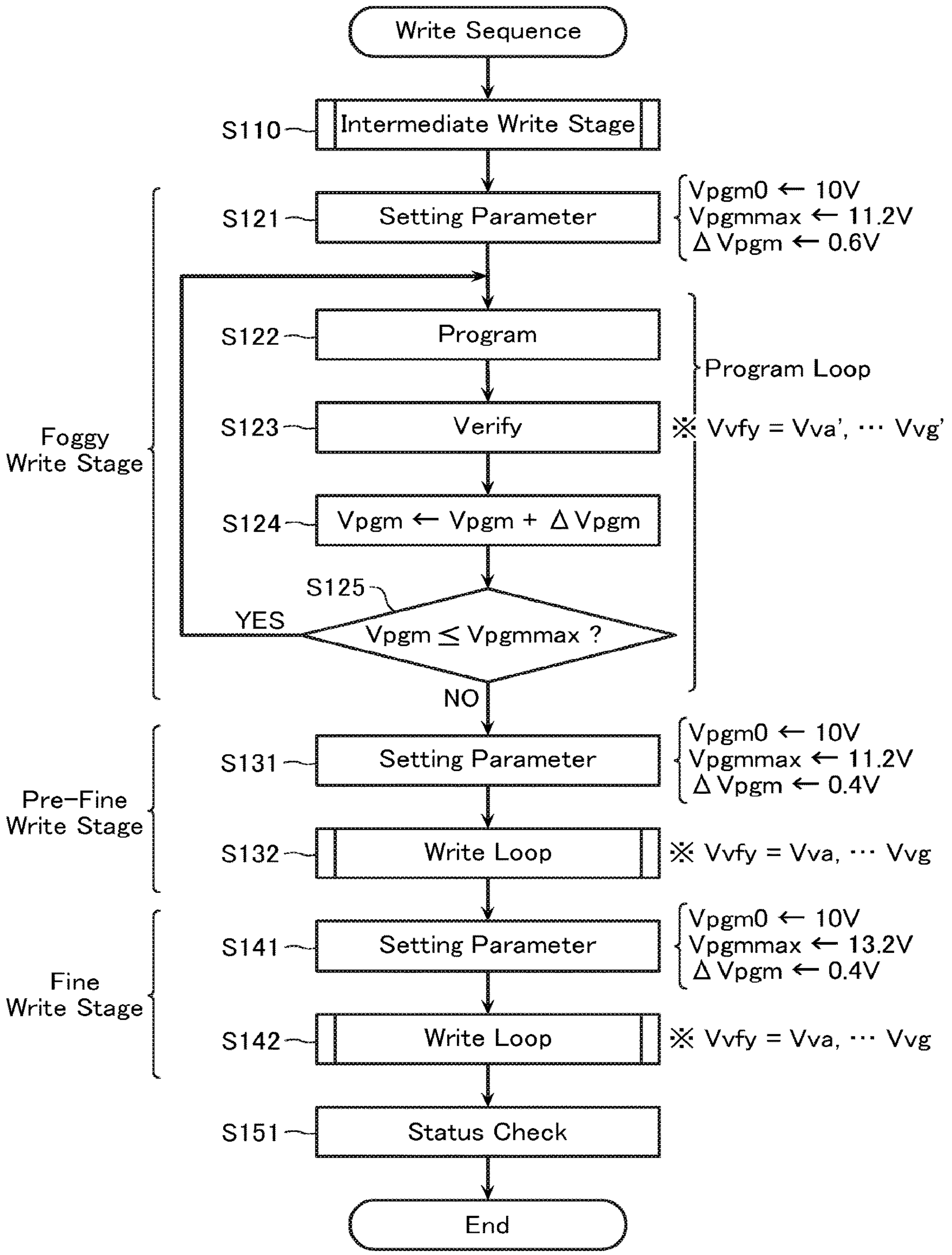
FIG. 6 is a flowchart of a write sequence in the semiconductor memory device according to the same embodiment.
Figure 7:
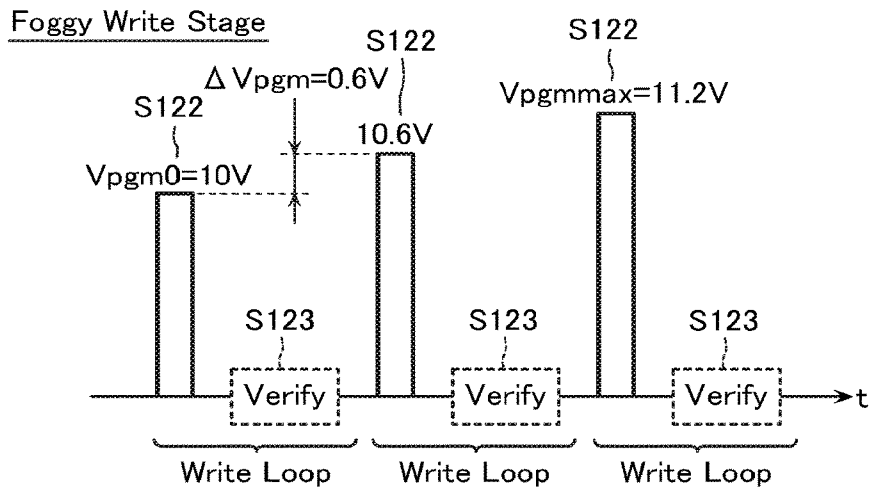
FIGS. 7 to 9 are views showing program pulses during the write sequence in the semiconductor memory device according to the same embodiment.
Figure 8:
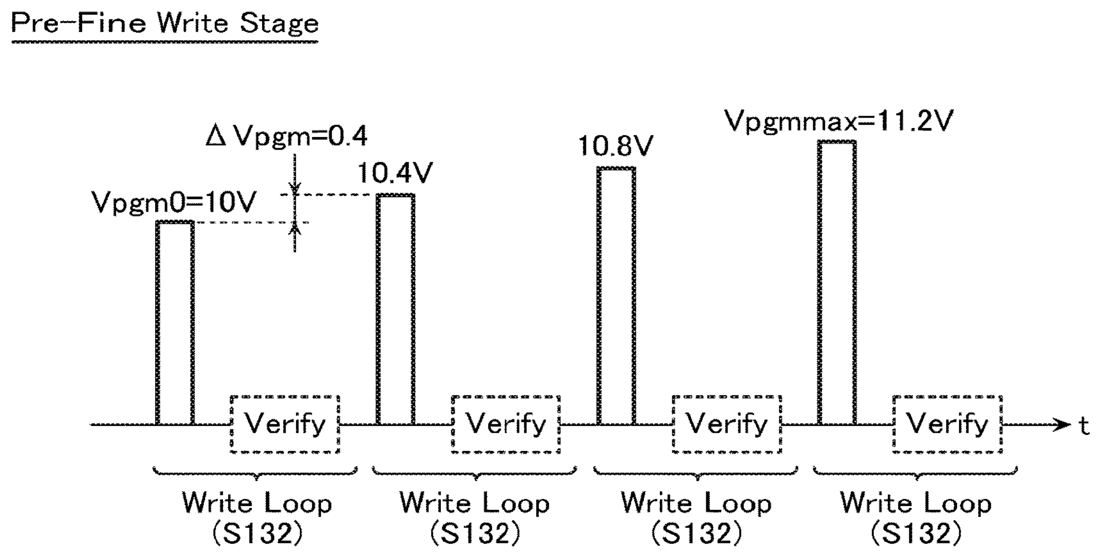
Figure 9:
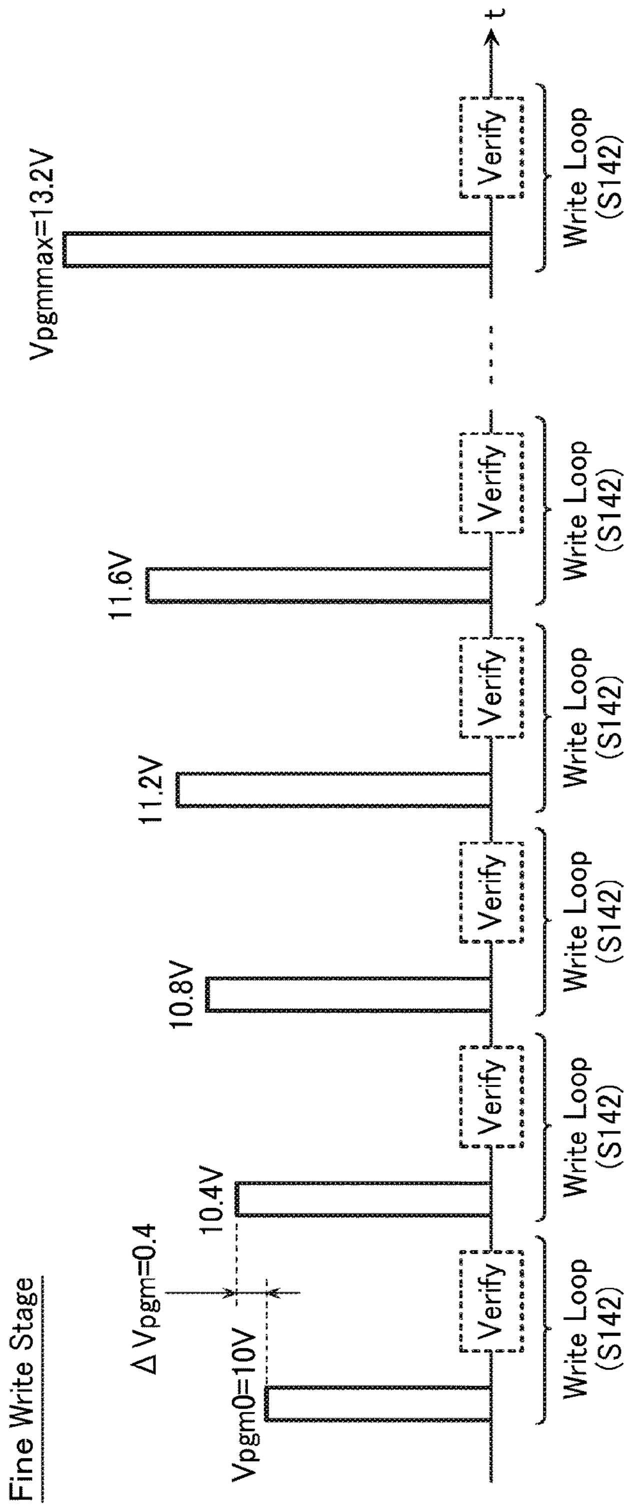
Figure 10:
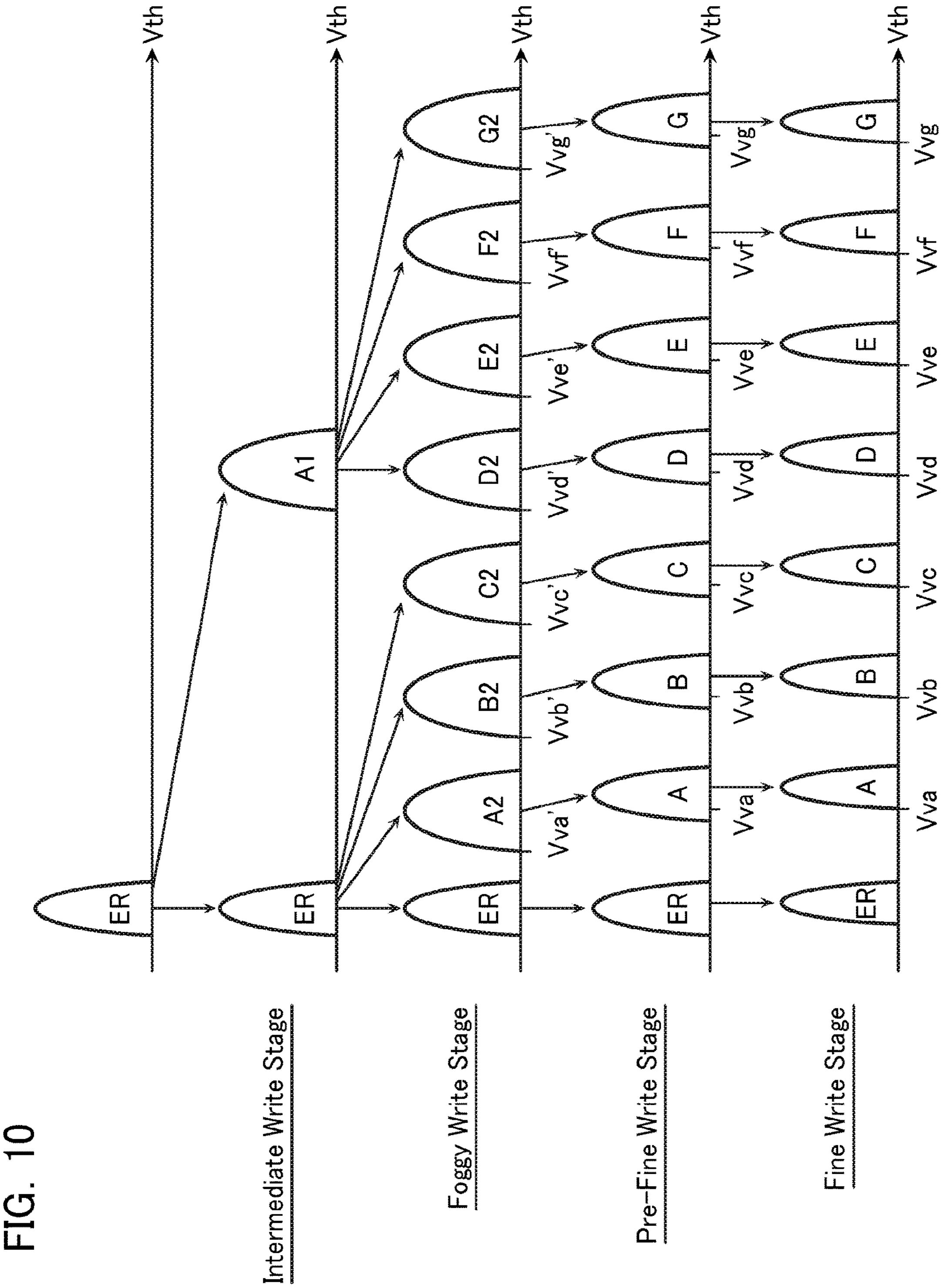
FIG. 10 is a view showing a state of transition of the threshold distribution of the memory cell during the write sequence in the semiconductor memory device according to the same embodiment.

FIG. 6 is a flowchart of the write sequence in the semiconductor memory device according to the present embodiment. Moreover, FIGS. 7 to 9 are views showing program pulses during the same write sequence; and FIG. 10 is a view showing a state of transition of the threshold distribution of the memory cell during the same write sequence.

In the present embodiment, 3 bits of data are written by a write sequence configured by four write stages.

First, in step S110, an intermediate write stage is executed. In the intermediate write stage, as shown in FIG. 10, a threshold distribution of the memory cell MC of the ER level is caused to undergo transition to an intermediate level. In the intermediate level, there are two levels, that is, ER and A1, from a low voltage side to the high voltage side. When finally setting the ER to C levels in the memory cell MC, the threshold voltage Vth is maintained at the ER level, and when finally setting the D to G levels in the memory cell MC, the threshold voltage Vth is caused to undergo transition to the A1 level.

In following steps S121 to S125, a foggy write stage is executed. In the foggy write stage, as shown in FIG. 10, a threshold distribution of the memory cell MC of the intermediate level is caused to undergo transition to a foggy level. In the foggy level, there are seven levels, that is, A2 to G2, from the low voltage side to the high voltage side. These A2 to G2 levels have a lower limit value and a broader distribution width than the finally set A to G levels. In this regard, the foggy write stage is considered to be a rough data write.

After start of the foggy write stage, in step S121, parameters for a write loop executed in following steps S122 to S125, are set. Included in the parameters set here are an initial amplitude Vpgm0, a maximum amplitude Vpgmmax, and an increment of amplitude ΔVpgm of a program pulse applied to the memory cell MC during the program operation. In the example of FIG. 6, the initial amplitude is set (initialized) to Vpgm0=10 V, the maximum amplitude is set (initialized) to Vpgmmax=11.2 V, and the increment is set (initialized) to ΔVpgm=0.6 V.

Next, in step S122, the program operation based on the parameters set in step S121 is executed. In the program operation, a program pulse having an amplitude Vpgm (program voltage) is applied to the memory cell MC, in the bias state shown in FIG. 4.

Next, in step S123, the verify operation is executed. In the verify operation, it is confirmed whether the memory cell MC has a desired threshold voltage Vth, in the bias state shown in FIG. 5. The verify voltage employed here is Vvfy=Vva', . . . , Vvg', and has the lower limit value of the threshold distribution of the foggy level.

Next, in step S124, the amplitude Vpgm of the program pulse is increased to a degree of the increment ΔVpgm, in preparation for the next program operation.

Next, in step S125, it is determined whether the amplitude Vpgm of the program pulse is less than or equal to the maximum amplitude Vpgmmax. In the case that Vpgm≤Vpgmmax, processing shifts to step S122, and in the case that Vpgm>Vpgmmax, processing shifts to step S131.

By repetition of the write loop configured from the above-described steps S122 to S124, a total of three program pulses having an initial amplitude Vpgm0=10V, an increment ΔVpgm=0.6 V, and a maximum amplitude Vpgmmax=11.2 V are applied to the memory cell MC, as shown in FIG. 7.

In following steps S131 and S132, a pre-fine write stage is executed in advance of a later-described fine write stage. In the pre-fine write stage, as shown in FIG. 10, a threshold distribution of the memory cell MC of the foggy level is caused to roughly undergo transition to a fine level.

After start of the pre-fine write stage, in step S131, similarly to in step S121, parameters for a write loop executed in following step S132, are set. Of the parameters set here, an initial amplitude Vpgm0 and an increment ΔVpgm are the same as those for the fine write stage, and a maximum amplitude Vpgmmax is smaller than that for the fine write stage. Moreover, in the pre-fine write stage, in order to cause the threshold distribution of the memory cell MC to undergo transition to the fine level, an increment ΔVpgm which is smaller than that for the foggy write stage, is provided. In the example of FIG. 6, the initial amplitude is set (initialized) to Vpgm0=10 V, the maximum amplitude is set (initialized) to Vpgmmax=11.2 V, and the increment is set (initialized) to ΔVpgm=0.4 V.

Next, in step S132, a write loop similar to that of steps S122 to S125 is repeatedly executed based on the parameters set in step S131. By step S132, a total of four program pulses having an initial amplitude Vpgm0=10V, an increment ΔVpgm=0.4 V, and a maximum amplitude Vpgmmax=11.2 V are applied to the memory cell MC, as shown in FIG. 8. Moreover, in the pre-fine write stage, similarly to in the fine write stage, a verify operation is executed adopting lower limit values Vva, . . . , Vvg of a threshold distribution of the fine level as the verify voltage Vvfy. As a result, the threshold distribution of the memory cell MC after execution of the pre-fine write stage can be brought even closer to the fine level than the foggy level is.

Now, as previously mentioned, the pre-fine write stage is a stage having an object of causing the threshold distribution of the memory cell MC to roughly undergo transition to the fine level, hence the maximum amplitude Vpgmmax employed here is kept lower than that for the fine write stage. As a result, as shown in FIG. 10, the threshold distribution of the memory cell MC after execution of the pre-fine write stage has a somewhat broader distribution width than the threshold distribution of the fine level which is desired to be finally set.

In following steps S141 and S142, the fine write stage is executed. In the fine write stage, as shown in FIG. 10, the threshold distribution of the memory cell MC which has to a certain extent been brought close to the fine level by the pre-fine write stage, is further caused to undergo transition to the fine level.

After start of the fine write stage, in step S141, similarly to in step S121, parameters for a write loop executed in following step S142, are set. Of these, the maximum amplitude Vpgmmax is different from that for the pre-fine write stage, and is set to a value sufficient to cause the threshold distribution of the memory cell MC to undergo transition to the fine level. In the example of FIG. 6, the initial amplitude is set (initialized) to Vpgm0=10 V, the maximum amplitude is set (initialized) to Vpgmmax=13.2 V, and the increment is set (initialized) to ΔVpgm=0.4 V.

Next, in step S142, a write loop similar to that of steps S122 to S125 is repeatedly executed based on the parameters set in step S141. By step S142, a total of nine program pulses, which is more than during the pre-fine write stage, having an initial amplitude Vpgm0=10V, an increment ΔVpgm=0.4 V, and a maximum amplitude Vpgmmax=13.2 V are applied to the memory cell MC, as shown in FIG. 9. Moreover, in the fine write stage, a verify operation is executed adopting lower limit values Vva, . . . , Vvg of the threshold distribution of the fine level as the verify voltage Vvfy.

Now, as shown in FIG. 10, the threshold distribution of the memory cell MC after execution of the fine write stage has undergone transition to a desired fine level, excluding some errors.

Finally, in step S151, it is confirmed whether data write to the memory cell MC has been completed normally, based on a verify result obtained in step S142.

That concludes the write sequence of the present embodiment.

Next, advantages of the above-described write sequence will be described using a comparative example.

One application of a flash memory is an SSD (Solid State Drive), and in recent years, this SSD has become utilized in servers, and so on, due to its high speed and power saving characteristics. Particularly, in the case of business-oriented servers, not only write speed but also read response speed becomes important, hence a read-intensive type SSD excelling in read performance is employed.

On the other hand, in the flash memory, generally, a write time is longer than a read time, and a write sequence requires a time exceeding 1 ms. Therefore, in the case that the flash memory has received a read command during write sequence execution, if a read sequence is started after waiting for write sequence completion, then read response ends up slowing. Therefore, in the case of a flash memory of the kind employed in a read-intensive type SSD, there is desirably a processing in which the write sequence is once suspended, the read sequence is executed, and then the write sequence is resumed. However, when the suspended write sequence is resumed, a double recording operation on the same memory region is executed, hence there is concern about lowering of data reliability.

Moreover, flash memories include the likes of a business-oriented 2 bits/cell flash memory (hereafter, referred to as "eMLC"), a personal/household-oriented 2 bits/cell flash memory (hereafter, referred to as "cMLC"), and a personal/household-oriented 3 bits/cell flash memory (hereafter, referred to as "TLC"). Of these, the eMLC is advantageous compared to the cMLC or TLC in having a large number of times rewritable and a high reliability, but is disadvantageous compared to the cMLC or TLC in terms of cost since the likes of a special process or test step to achieve these advantages is required. Therefore, when considering utilization in a read-intensive type SSD where the number of times rewritable may be small, utilization of the cMLC or TLC could be said to be desirable in terms of cost. However, even a read-intensive type flash memory is in fact not infrequently utilized in applications having a large number of times of rewrites, hence some kind of innovation for improvement of reliability becomes required.

Accordingly, conceivable is a write sequence configuring a comparative example shown below. This write sequence is particularly effective in the case of the TLC.

The write sequence of the comparative example is roughly configured by three stages, that is, the intermediate write stage, the foggy write stage, and the fine write stage, excluding the pre-fine write stage from the write sequence of the present embodiment.

In the case of the write sequence of the comparative example, in order to increase the number of times rewritable, it is effective to reduce the increment of the amplitude of the program pulse employed in each of the write stages and narrow the distribution width of the threshold distribution of the memory cell. However, when the increment of the program pulse is reduced, it becomes a problem that processing time of the write sequence, in other words, the time required for data write lengthens. Moreover, in the case of the comparative example, setting of the fine level in the memory cell MC is achieved by a fine write stage finally executed one time only. Therefore, it also becomes a problem that a threshold voltage Vth drop (so-called high speed threshold drop) that may occur immediately after execution of the fine write stage cannot be relieved.

In this respect, in the write sequence of the present embodiment, setting of the fine level in the memory cell MC is achieved by dividing into two write stages. As a result, a high speed threshold drop occurring immediately after execution of the pre-fine write stage can be relieved by the fine write stage.

Moreover, in the case of the write sequence of the present embodiment, the threshold distribution of the memory cell MC substantially undergoes transition to the fine level by the pre-fine write stage. Therefore, since there is no need to cause the threshold voltage Vth of the memory cell MC to undergo a large transition in the fine write stage, an effect on an adjacent memory cell MC occurring in the fine write stage can also be reduced compared to in the comparative example. As a result, the write sequence of the present embodiment enables the distribution width of the threshold distribution of the memory cell MC to be narrowed. Moreover, a greater advantage is obtained in terms of narrowing of the threshold distribution in the case that setting of the fine level is divided into a plurality of write stages than in the case that the increment ΔVpgm is simply reduced.

Figure 11:
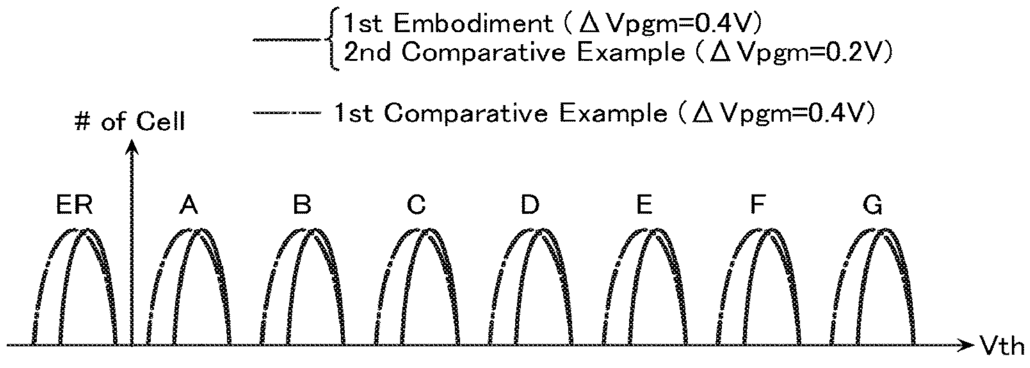
FIG. 11 is a view showing a threshold distribution of a memory cell of semiconductor memory devices according to the same embodiment and a comparative example.

For example, if it is assumed that the increment for the fine write stage of the present embodiment is ΔVpgm=0.4 V, and that cases of the comparative example where the increments for the fine write stage are set to ΔVpgm=0.4 V and ΔVpgm=0.2 V are, respectively, a "first comparative example" and a "second comparative example", then the threshold distributions of the memory cell MC after write sequence execution of the present embodiment, the first comparative example, and the second comparative example are as in FIG. 11. The solid line in FIG. 11 is the case of the present embodiment and the second comparative example, and the dot-chain line in FIG. 11 is the case of the first comparative example. As shown in FIG. 11, the present embodiment not only makes it possible for the distribution width to be more narrowed compared to in the first comparative example having the same increment ΔVpgm, but also makes it possible for an identical distribution width to be obtained even compared to the second comparative example whose increment ΔVpgm is smaller than that of the present embodiment.

Furthermore, in the case of the present embodiment, the initial amplitude Vpgm0 for the fine write stage is set the same as that for the pre-fine write stage. As a result, a large program pulse is not suddenly applied to the memory cell MC at the start of the fine write stage, hence it is possible to avoid occurrence of over-program where the threshold voltage Vth exceeds an upper limit value of the desired threshold distribution.

Figure 12:
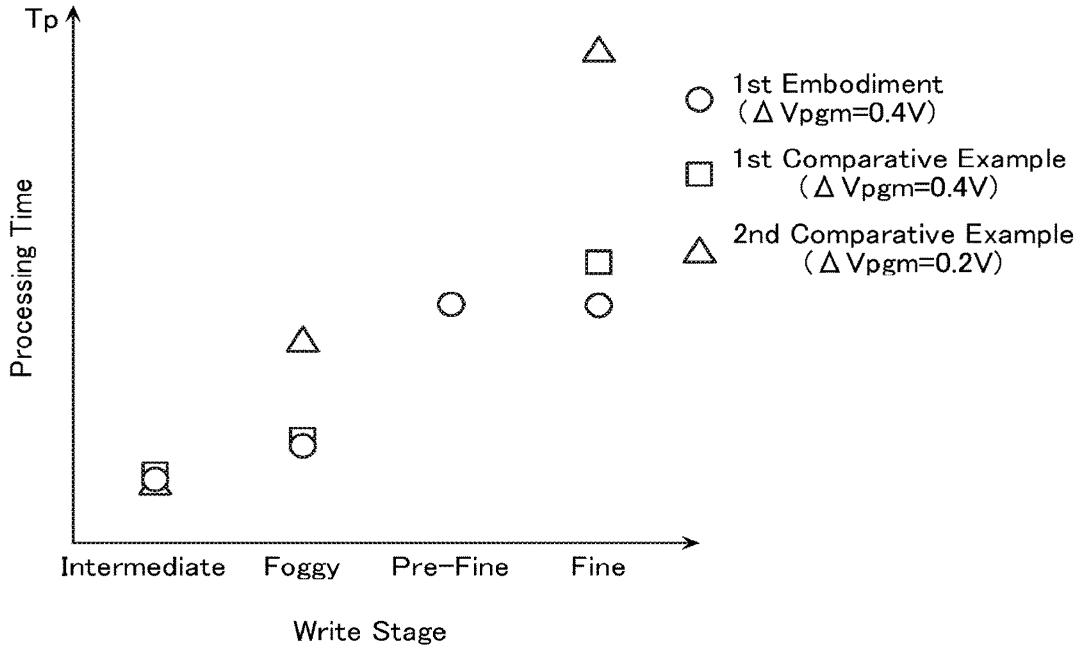
FIG. 12 is a graph showing processing time for each stage of write sequences of the semiconductor memory devices according to the same embodiment and the comparative example.

Note that in the case of the present embodiment, there is concern about lengthening of the write sequence due to there being the pre-fine write stage which is not present in the comparative example. However, as shown in FIG. 12, when processing times Tp of each of the write stages excluding the pre-fine write stage are compared, it is found that that of the present embodiment (white circle in FIG. 12) is about the same as that of the first comparative example (white square in FIG. 12) and is shorter than that of the second comparative example (white triangle in FIG. 12). Particularly regarding the fine write stage, the processing time Tp of the present embodiment is found to be more significantly reduced compared to that of the second comparative example. This is due to the fact that in the case of the present embodiment, setting of a rough fine level to the memory cell MC has finished at a finish time of the pre-fine write stage, and processing of the verify operation during the fine write stage can be significantly abbreviated. Moreover, since the maximum amplitude Vpgmmax employed in the pre-fine write stage is kept low and the number of write loops repeated also is not large, the processing time Tp of the pre-fine write stage also is kept equal to that of the fine write stage. As a result, the present embodiment makes it possible for the processing time of the write sequence overall to be more reduced, in spite of the number of write stages being more numerous by one, compared to the second comparative example where about the same distribution width is obtained.

Furthermore, due to the present embodiment, the processing time Tp of the write stage that takes the longest time for processing can be reduced more than that of the comparative example. As a result, a speedy read response becomes possible even when, for example, an interruption of data read can only be received in a write stage unit. Specifically, in the case of FIG. 11, in the second comparative example, at worst, there will be a wait for start of the read sequence for as much as the processing time Tp of the fine write stage, but in the present embodiment, it is only required to wait for as much as the processing time Tp of the fine write stage which is about half that of the second comparative example.

In other words, the present embodiment makes it possible to provide a semiconductor memory device in which the number of times rewritable can be more increased by suppressing variation in threshold voltage of the memory cell and in which read response can be more speeded up, compared to in the comparative example.

Note that described above as an example was the case where a portion corresponding to the fine write stage of the comparative example was divided into two write stages, but the present embodiment can be applied also to other than the fine write stage, such as to the foggy write stage. The present embodiment is particularly effective in a write stage having a long processing time Tp or a write stage where it is desired to suppress variation in threshold voltage Vth of the memory cell MC after execution.

Second Embodiment

The first embodiment was described assuming a semiconductor memory device permitting an interruption of data read in a write stage unit. In contrast, in a second embodiment, a write sequence of a semiconductor memory device permitting an interruption of data read regardless of the write stage, will be described.

Figure 13:
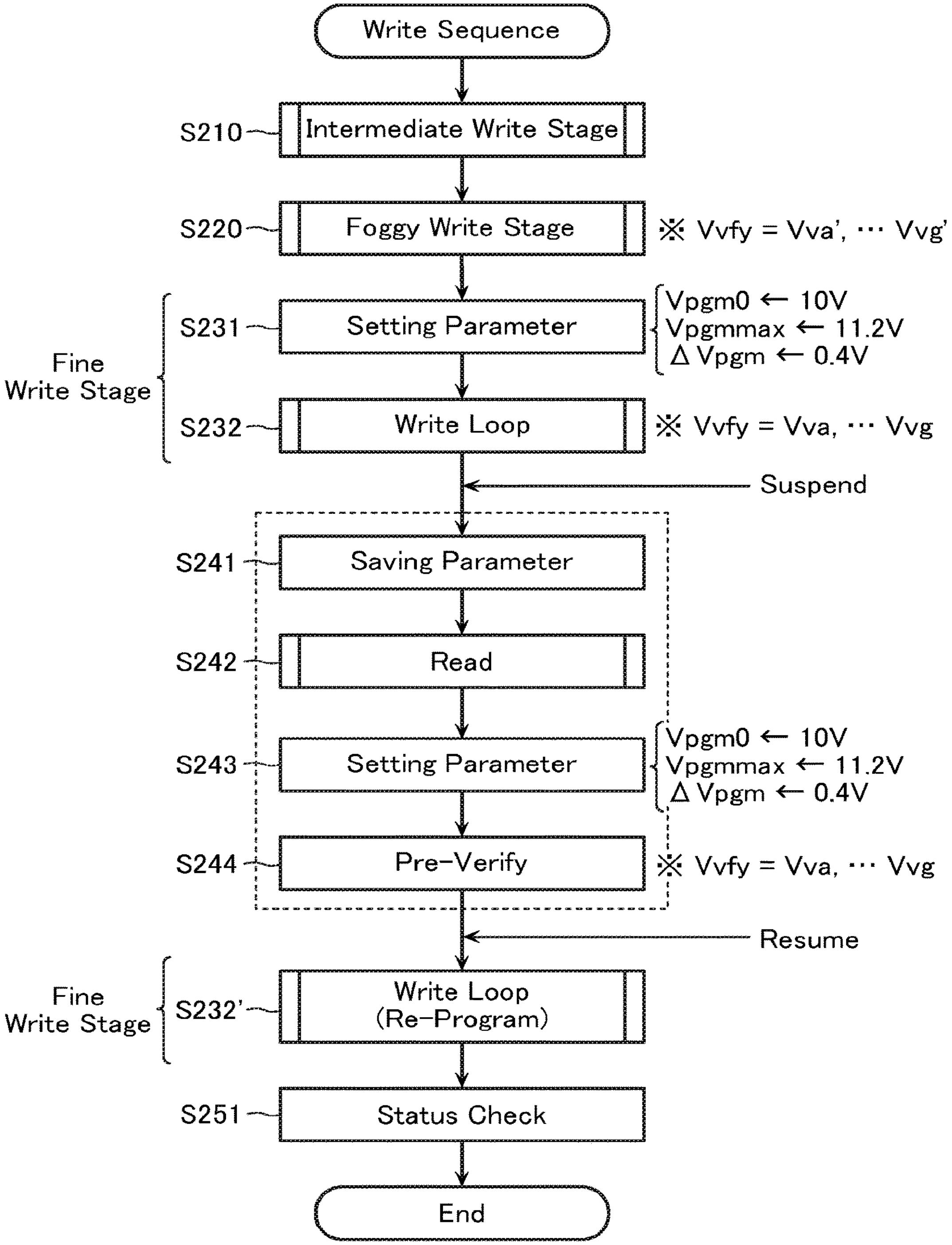
FIG. 13 is a flowchart of a write sequence in a semiconductor memory device according to a second embodiment.
Figure 14:
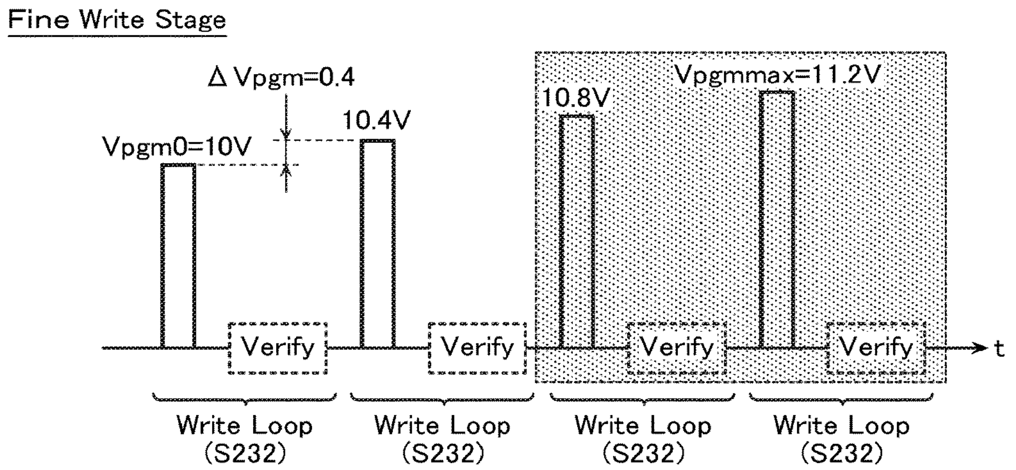
FIGS. 14 to 16 are views showing a program pulse during the write sequence in the semiconductor memory device according to the same embodiment.
Figure 15:
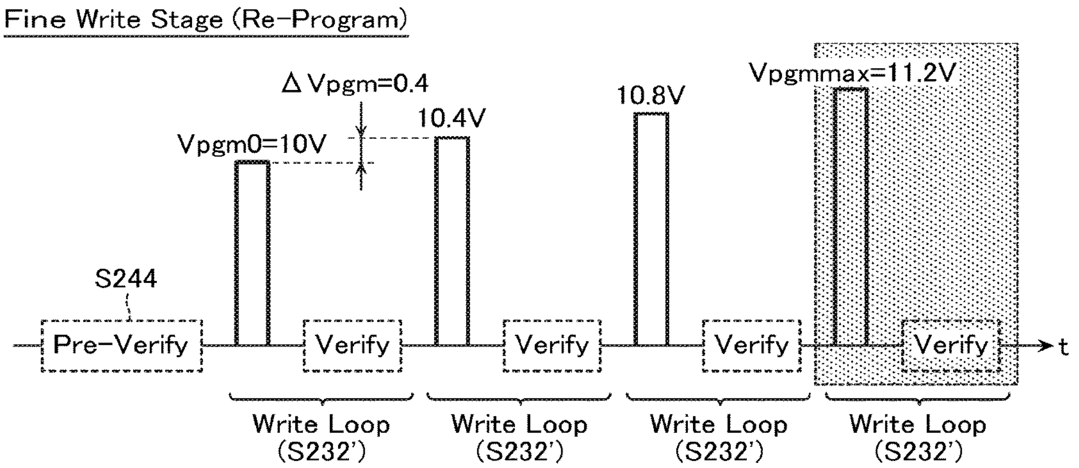
Figure 16:
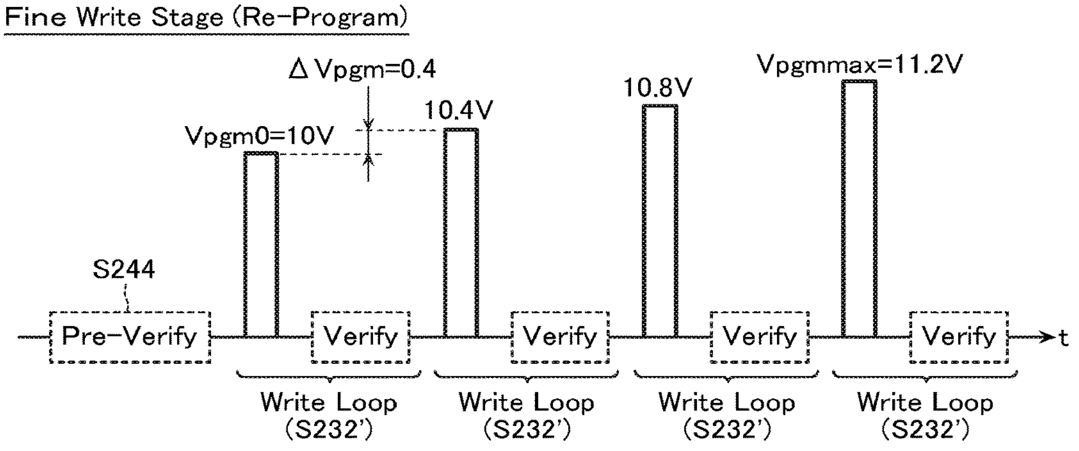

FIG. 13 is a flowchart of the write sequence in the semiconductor memory device according to the second embodiment. Moreover, FIGS. 14 to 16 are views showing a program pulse during the same write sequence.

The write sequence of the present embodiment, similarly to that of the comparative example mentioned in the description of the first embodiment, is configured from: the intermediate write stage that causes the threshold distribution of the memory cell MC of the erase state to undergo transition to the intermediate level; the foggy write stage that causes the threshold distribution of the memory cell MC of the intermediate level to undergo transition to the foggy level; and the fine write stage that causes the threshold distribution of the memory cell MC of the foggy level to undergo transition to the fine level.

First, in step S210, similarly to in step S110 of FIG. 6, the intermediate write stage is executed. After execution of the intermediate write stage, the threshold distribution of the memory cell MC has undergone transition to the intermediate level.

Next, in step S220, similarly to in steps S121 to S125 of FIG. 6, the foggy write stage is executed. After execution of the foggy write stage, the threshold distribution of the memory cell MC has undergone transition to the foggy level.

In following steps S231 and S232, the fine write stage is executed.

After start of the fine write stage, in step S231, parameters for a write loop executed in following step S232, are set. In the example of FIG. 13, the initial amplitude is set (initialized) to Vpgm0=10 V, the maximum amplitude is set (initialized) to Vpgmmax=11.2 V, and the increment is set (initialized) to Vpgm=0.4 V. Note that the maximum amplitude Vpgmmax set here has a value sufficient to cause the threshold distribution of the memory cell MC to undergo transition to the fine level.

Next, in step S232, a write loop similar to that of steps S122 to S125 of FIG. 6 is repeatedly executed based on the parameters set in step S231. By step S232, a total of four program pulses having an initial amplitude Vpgm0=10V, an increment ΔVpgm=0.4 V, and a maximum amplitude Vpgmmax=11.2 V are applied to the memory cell MC, as shown in FIG. 14. Moreover, in the fine write stage, a verify operation is executed adopting lower limit values Vva, . . . , Vvg of the threshold distribution of the fine level as the verify voltage Vvfy.

Now, let it be assumed that a read command is issued to the controller 11 when the program pulse of amplitude Vpgm=10.4 V is being applied. In this case, the controller 11 instructs the NAND chip 10 to suspend the fine write stage. As a result, in step S132, the shaded portion in FIG. 14 of the fine write stage is stopped from being executed.

After suspension of the fine write stage, in step S241, various kinds of parameters required for resumption of the fine write stage are saved.

Next, in step S242, a read operation is executed. A result of this read operation is outputted to external as read data.

Next, in step S243, parameters for a write loop executed in following step S232' are set for resumption of the fine write stage. Here, the initial amplitude Vpgm0, the maximum amplitude Vpgmmax, and the increment ΔVpgm are reset to the same values as during step S232.

Next, in step S244, a re-verify operation is executed. The re-verify operation is executed adopting lower limit values Vva, . . . , Vvg of the threshold distribution of the fine level as the verify voltage Vvfy, similarly to in step S232.

After going through the above-described steps S241 to S244 surrounded by the broken line of FIG. 13, the once suspended fine write stage is resumed.

After resumption of the fine write stage, in step S232', a write loop is repeatedly executed based on the parameters set in step S243. In other words, in this step S232', as shown in FIG. 15, the fine write stage is re-executed on the memory cell MC from its initial write loop.

Now, let it further be assumed that a read command is issued to the controller 11 when the program pulse of amplitude Vpgm=10.8 V is being applied. In this case, in the current write step S232', the shaded portion in FIG. 15 is stopped from being executed. Then subsequently, in step S232', after going through processings of steps S241 to S244, the fine write stage gets re-executed from its initial write loop.

In this way, in the present embodiment, as shown in FIG. 16, the write loop of the fine write stage is repeatedly executed from the beginning until the program pulse of maximum amplitude Vpgmmax=11.2 V is applied to the memory cell MC.

Finally, in step S251, it is confirmed whether data write to the memory cell MC has been completed normally, based on a verify result obtained in step S232 or S232'.

That concludes the write sequence of the present embodiment.

In a device where read response speed is required, even when the device is in the middle of execution of the write sequence, processing of the write sequence gets immediately suspended to execute a read sequence. However, at this time, if the write stage is simply suspended and resumed, the following problem occurs.

In other words, when suspension/resumption is repeated just before write stage completion, the memory cell whose data write has been completed gets repeatedly applied with the program voltage. In this case, the threshold voltage of the memory cell whose data write has at great pains been completed ends up deviating from a desired threshold distribution.

In this regard, in the present embodiment, the pre-verify operation is executed in step S244 before resumption of the fine write stage. As a result, memory cells MC whose data write has been completed are revealed, hence these memory cells MC can be prevented from being applied with an unnecessary program pulse.

Moreover, in the case of the present embodiment, after resumption of the fine write stage, the fine write stage is re-executed from its initial write loop. In that sense, the fine write stage before resumption in the present embodiment plays a role of the pre-fine write stage in the first embodiment, and the fine write stage after resumption in the present embodiment plays a role of the fine write stage in the first embodiment. In other words, variation in the threshold voltage Vth of the memory cell MC can be suppressed also in the present embodiment, similarly to in the first embodiment.

Note that when suspension/resumption of the write stage is repeated, there is concern about occurrence of a defect due to the pass voltage Vpass of an unselected word line WL adjacent to the selected word line WL. Regarding this problem, occurrence of the defect can be reduced by keeping the pass voltage Vpass during the write operation and the verify operation low.

Moreover, in the case where suspension/resumption of the write stage occurs frequently, if the write stage is resumed from its initial write loop each time, then there is concern about lengthening of the write stage. Regarding this problem, for example, a write sequence shown in FIG. 17 is effective.

Figure 17:
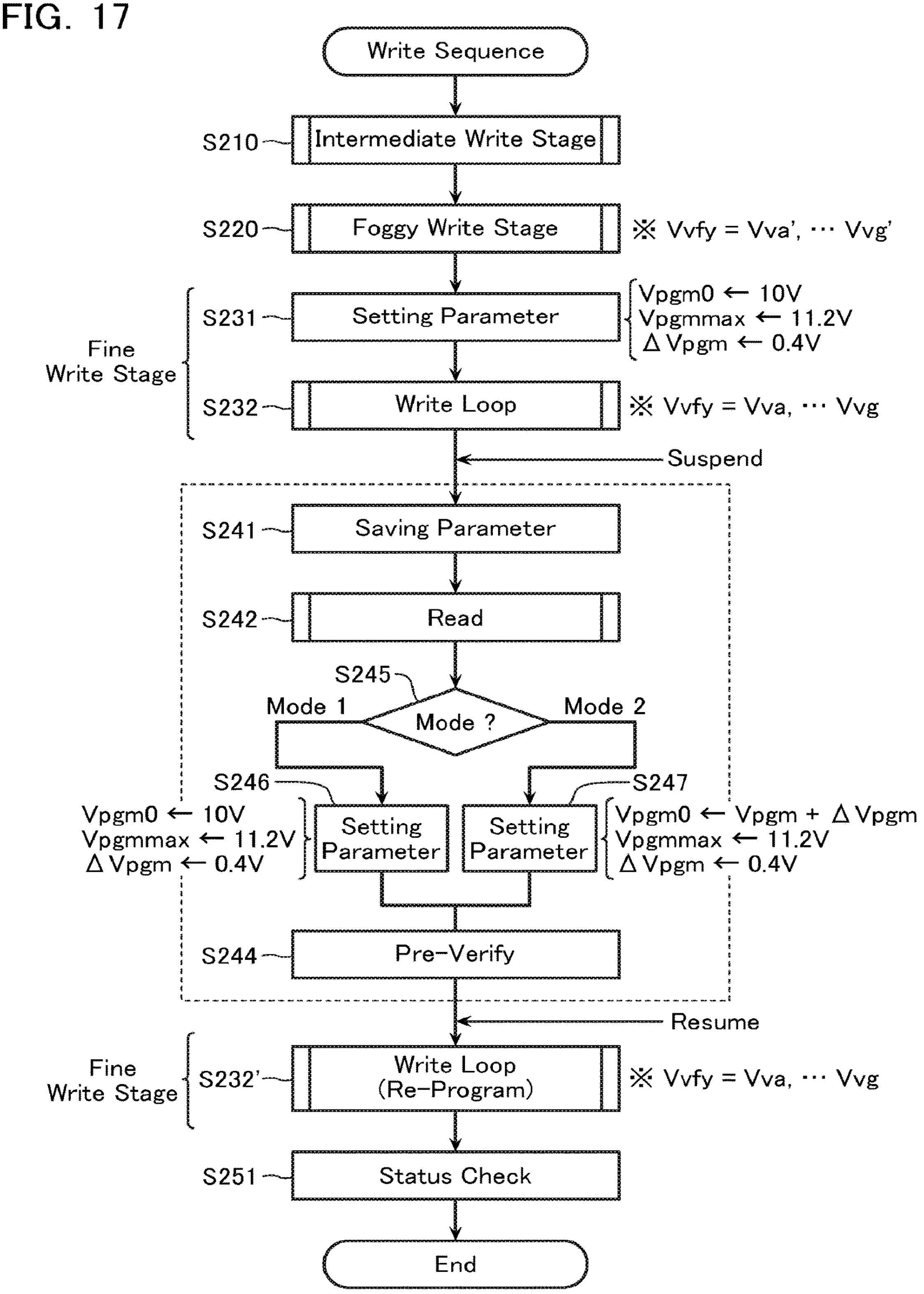
FIG. 17 is a flowchart of another write sequence in the semiconductor memory device according to the same embodiment.

In other words, in interruption processing surrounded by the broken line in FIG. 17, steps S245 to S247 substituting for step S243 of FIG. 13 are executed. In step S245, one operation mode is selected from a plurality of operation modes based on a certain condition. Moreover, when the operation mode is 1, processing shifts to step S246, and when the operation mode is 2, processing shifts to step S247.

Operation mode 1 is a mode for when there are still few suspensions/resumptions of the fine write stage, or when total processing time of the fine write stage has not exceeded a fixed time. In this case, in step S246, parameters are set such that the fine write stage after resumption in step S232' is executed from the initial write loop. In other words, the initial amplitude is set to Vpgm0=10 V.

Figure 18:
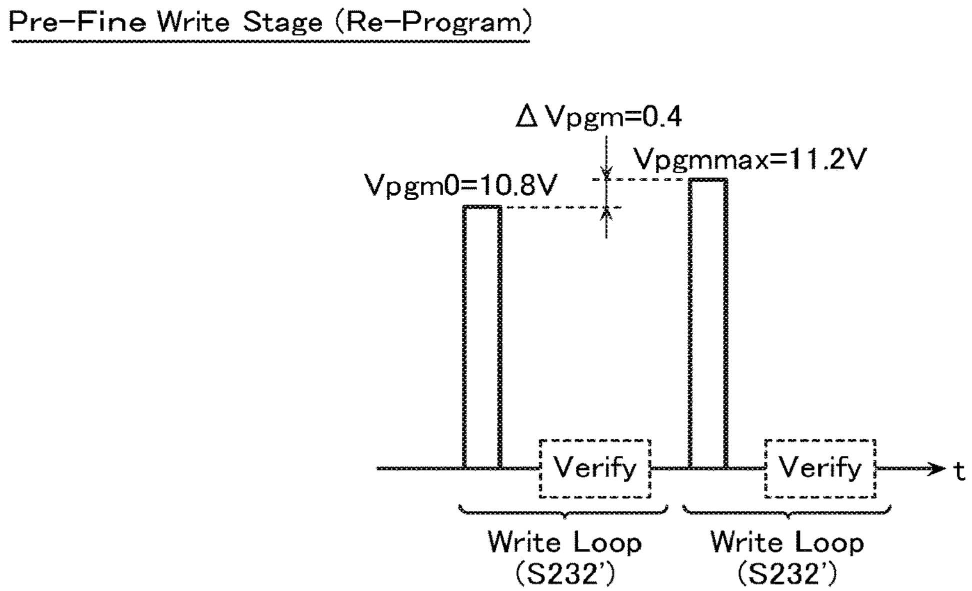
FIG. 18 is a view showing a program pulse during the other write sequence in the semiconductor memory device according to the same embodiment.

On the other hand, operation mode 2 is a mode for when there are already many suspensions/resumptions of the fine write stage, or when total processing time of the fine write stage has exceeded a fixed time. In this case, in step S247, parameters are set such that the fine write stage after resumption in step S232' is executed from a continuation of the fine write stage before suspension. In other words, the initial amplitude Vpgm0 has a value of the increment ΔVpgm added to the amplitude Vpgm of the program pulse last applied in the fine write stage before suspension. In this case, for example, if the amplitude of the program pulse last applied in the fine write stage before suspension is Vpgm=10.4 V, then, as shown in FIG. 18, the fine write stage after resumption gets started from application of the program pulse of amplitude Vpgm=10.8 V.

In this way, if operation after resumption of the write stage is configured to be switchable based on a certain condition, then excessive lengthening of the write stage can be avoided.

Moreover, described above as an example was processing of suspension/resumption in the fine write stage, but the present embodiment can be applied also to other than the fine write stage, such as to the foggy write stage.

Third Embodiment

A third embodiment describes a semiconductor memory device in which the suspension/resumption processing of the second embodiment has been applied to the write sequence of the first embodiment.

Figure 19:
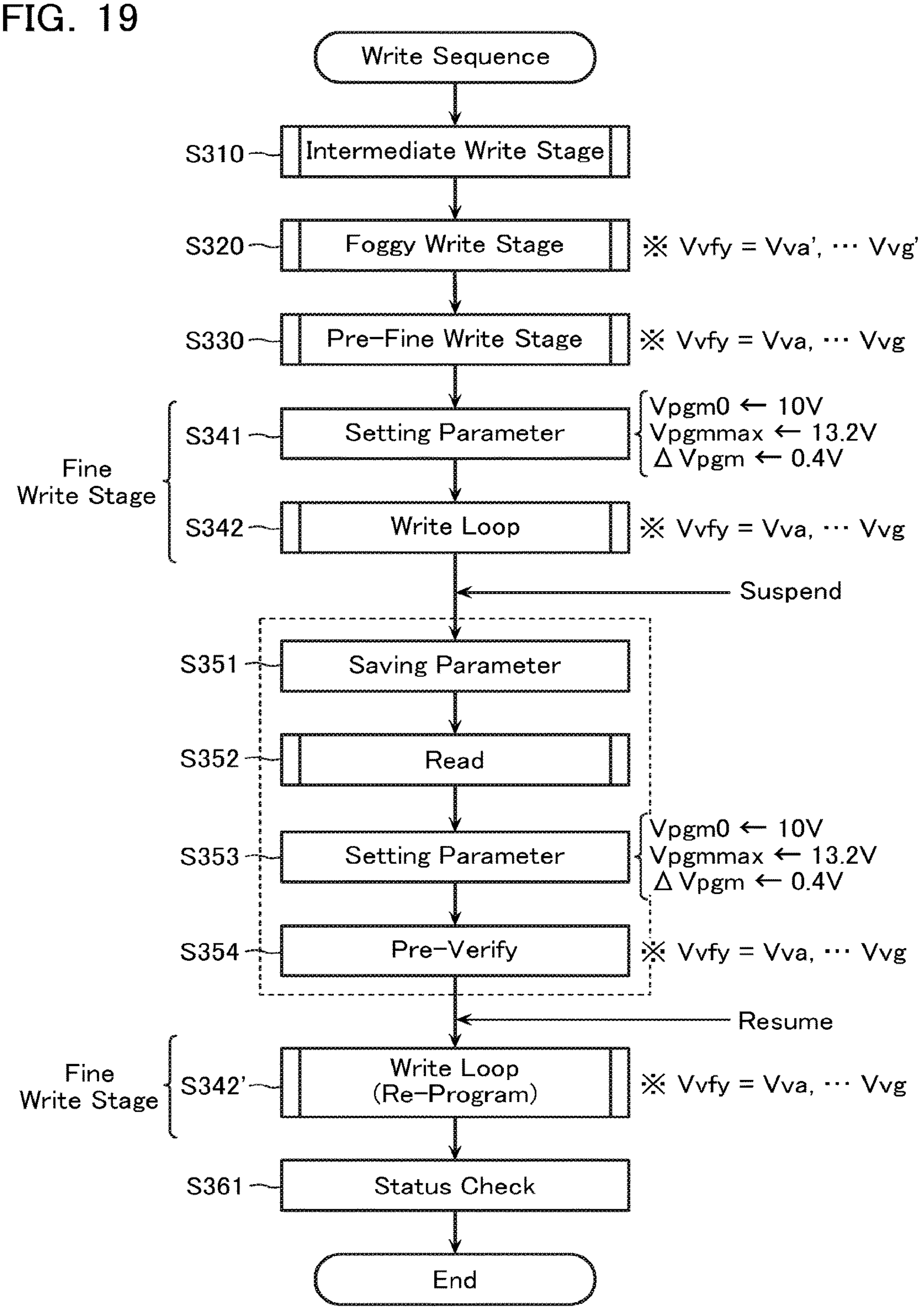
FIG. 19 is a flowchart of a write sequence in a semiconductor memory device according to a third embodiment.

FIG. 19 is a flowchart of a write sequence in the semiconductor memory device according to the present embodiment.

First, in steps S310, S320, S330, and S341 and S342, the intermediate write stage, the foggy write stage, the pre-fine write stage, and the fine write stage similar to those of steps S110, S121 to S125, S131, and S132, and S141 and S142 of FIG. 6, are executed. Note that in the present embodiment also, similarly to in the first embodiment, the initial amplitude Vpgm0=10 V and the increment ΔVpgm=0.4 V for the pre-fine write stage are the same as those for the fine write stage, and the maximum amplitude Vpgmmax=11.2 V for the pre-fine write stage is lower than the maximum amplitude Vpgmmax=13.2 V for the fine write stage.

Now, let it be assumed that a read command is issued to the controller 11 during processing of the fine write stage. In this case, the controller 11 instructs the NAND chip 10 to suspend the fine write stage and to start interruption processing surrounded by the broken line in FIG. 19.

After suspension of the fine write stage, in steps S351 to S354, the interruption processing similar to that of steps S241 to S244 of FIG. 13 is executed.

After resumption of the fine write stage, in step S342', the fine write stage is re-executed from its initial write loop.

Finally, in step S361, it is confirmed whether data has been written normally to the memory cell MC, based on a verify result of step S342 or steps S354 and S342'.

That concludes the write sequence of the present embodiment.

In the case of the present embodiment, during setting of the fine level, the pre-fine write stage is executed similarly to in the first embodiment and an intermediate processing similar to that of the second embodiment is executed during the fine write stage. As a result, the present embodiment makes it possible to obtain similar advantages to those of the first and second embodiments.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the above-described embodiments can also be applied to a semiconductor memory device having a three-dimensional structure in which a semiconductor film acting as a channel of memory cells configuring a memory string is disposed perpendicularly to a semiconductor substrate, and these memory cells are arranged in a perpendicular direction to the semiconductor substrate. In addition, the above-described embodiments are not limited to 3 bits/cell, and may be applied also in the cases of 2 bits/cell or 4 or more bits/cell.

What is claimed is:

1. A semiconductor memory device, comprising:

a memory cell array including a plurality of memory cells that are NAND-connected; and a control circuit that executes a write sequence, the write sequence writing data to the memory cells, the write sequence including a plurality of write stages, one of the write stages applying to the memory cells a plurality of program pulses whose amplitudes increase by a certain increment, the write stages including 1st to Nth, where N is an integer of 2 or more, write stages, and an initial amplitude and the increment of the program pulse applied in the N−1th write stage being the same as an initial amplitude and the increment of the program pulse applied in the Nth write stage, and the number of the program pulses applied in the N−1th write stage being fewer than the number of the program pulses applied in the Nth write stage.

2. The semiconductor memory device according to claim 1, wherein the control circuit, during the write sequence, executes a verify operation that determines whether a threshold voltage of the memory cells is a certain verify voltage or less, and the verify voltage employed in the verify operation in the N−1th write stage is the same as the verify voltage employed in the verify operation in the Nth write stage.

3. The semiconductor memory device according to claim 1, wherein the control circuit, during the write sequence, executes a verify operation that determines whether a threshold voltage of the memory cells is a certain verify voltage or less, and the verify voltage employed in the verify operation in the N−2th, where N is an integer of 3 or more, write stage is lower than the verify voltage employed in the verify operation in the N−1th and Nth write stages.

4. The semiconductor memory device according to claim 1, wherein a maximum amplitude of the program pulse applied in the N−1th write stage is smaller than a maximum amplitude of the program pulse applied in the Nth write stage.

5. The semiconductor memory device according to claim 1, wherein one of the memory cells stores M values, where M is an integer of 3 or more, and the control circuit, during the N−3th, where N is an integer of 4 or more, write stage, causes a threshold distribution of the memory cells to undergo transition to M1, where M1 is an integer less than M, levels, and during the N−2th to Nth write stages, causes the threshold distribution of the memory cells to undergo transition to M levels.

6. The semiconductor memory device according to claim 1, wherein the increment of the program pulse applied in the N−2th, where N is an integer of 3 or more, write stage is smaller than the increment of the program pulse applied in the N−1th and Nth write stages.

7. A semiconductor memory device, comprising:

a memory cell array including a plurality of memory cells that are NAND-connected; and a control circuit that executes a write sequence, the write sequence writing data to the memory cells, the write sequence including a plurality of write stages, one of the write stages applying to the memory cells a plurality of program pulses whose amplitudes increase by a certain increment, the write stages including 1st to Nth, where N is an integer of 2 or more, write stages, the control circuit, during the write sequence, having a first mode that authorizes suspension of the Nth write stage, and in the first mode, an initial amplitude and the increment of the program pulse applied in the Nth write stage before suspension being the same as an initial amplitude and the increment of the program pulse applied in the Nth write stage after resumption.

8. The semiconductor memory device according to claim 7, wherein the control circuit, during the write sequence, executes a verify operation that determines whether a threshold voltage of the memory cells is a certain verify voltage or less, and the verify voltage employed in the verify operation in the Nth write stage before suspension is the same as the verify voltage employed in the verify operation in the Nth write stage after resumption.

9. The semiconductor memory device according to claim 7, wherein the control circuit, during the write sequence, executes a verify operation that determines whether a threshold voltage of the memory cells is a certain verify voltage or less, and the verify voltage employed in the verify operation in the N−1th write stage is lower than the verify voltage employed in the verify operation in the Nth write stage.

10. The semiconductor memory device according to claim 7, wherein one of the memory cells stores M values, where M is an integer of 3 or more, and the control circuit, during the N−2th, where N is an integer of 3 or more, write stage, causes a threshold distribution of the memory cells to undergo transition to M1, where M1 is an integer less than M, levels, and during the N−1th and Nth write stages, causes the threshold distribution of the memory cells to undergo transition to M levels.

11. The semiconductor memory device according to claim 7, wherein the control circuit, during the write sequence, has a second mode that authorizes suspension of the Nth write stage, and in the second mode, an initial amplitude of the program pulse employed in the Nth write stage after resumption has a value of a final amplitude of the program pulse employed in the Nth write stage before suspension increased to an extent of the increment.

12. The semiconductor memory device according to claim 7, wherein the increment of the program pulse applied in the N−1th write stage is smaller than the increment of the program pulse applied in the Nth write stage.

13. The semiconductor memory device according to claim 7, wherein the control circuit, after suspension and before resumption of the Nth write stage of the write sequence, executes a verify operation that confirms whether a threshold voltage of the memory cells is a certain verify voltage or less.

14. A semiconductor memory device, comprising:

a memory cell array including a plurality of memory cells that are NAND-connected; and a control circuit that executes a write sequence, the write sequence writing data to the memory cells, the write sequence including a plurality of write stages, one of the write stages applying to the memory cells a plurality of program pulses whose amplitudes increase by a certain increment, the write stages including 1st to Nth, where N is an integer of 2 or more, write stages, an initial amplitude and the increment of the program pulse applied in the N−1th write stage being the same as an initial amplitude and the increment of the program pulse applied in the Nth write stage, the control circuit, during the write sequence, authorizing suspension of the Nth write stage, and an initial amplitude and the increment of the program pulse applied in the Nth write stage before suspension being the same as an initial amplitude and the increment of the program pulse applied in the Nth write stage after resumption.

15. The semiconductor memory device according to claim 14, wherein the control circuit, during the write sequence, executes a verify operation that determines whether a threshold voltage of the memory cells is a certain verify voltage or less, and the verify voltage employed in the verify operation in the N−1th write stage is the same as the verify voltage employed in the verify operation in the Nth write stage.

16. The semiconductor memory device according to claim 14, wherein the control circuit, during the write sequence, executes a verify operation that determines whether a threshold voltage of the memory cells is a certain verify voltage or less, and the verify voltage employed in the verify operation in the N−2th, where N is an integer of 3 or more, write stage is lower than the verify voltage employed in the verify operation in the N−1th and Nth write stages.

17. The semiconductor memory device according to claim 14, wherein the number of the program pulses applied in the N−1th write stage is fewer than the number of the program pulses applied in the Nth write stage.

18. The semiconductor memory device according to claim 14, wherein a maximum amplitude of the program pulse applied in the N−1th write stage is smaller than a maximum amplitude of the program pulse applied in the Nth write stage.

19. The semiconductor memory device according to claim 14, wherein one of the memory cells stores M values, where M is an integer of 3 or more, and the control circuit, during the N−3th, where N is an integer of 4 or more, write stage, causes a threshold distribution of the memory cells to undergo transition to M1, where M1 is an integer less than M, levels, and during the N−2th to Nth write stages, causes the threshold distribution of the memory cells to undergo transition to M levels.

* * * * *